US012633334B2

(12) United States Patent
Kim et al.

(10) Patent No.: US 12,633,334 B2
(45) Date of Patent: May 19, 2026

(54) BITLINE SENSE AMPLIFIER FOR SETTING A VOLTAGE FOR A MEMORY CELL AND SEMICONDUCTOR DEVICE INCLUDING THE SAME

(71) Applicant: SAMSUNG ELECTRONICS CO., LTD., Suwon-si (KR)

(72) Inventors: Taeyun Kim, Suwon-si (KR); Donghwee Kim, Suwon-si (KR); Junmyung Woo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 242 days.

(21) Appl. No.: 18/511,443

(22) Filed: Nov. 16, 2023

(65) Prior Publication Data

US 2024/0371431 A1    Nov. 7, 2024

(30) Foreign Application Priority Data

May 3, 2023    (KR) ........................ 10-2023-0057643

(51) Int. Cl.
| | |
|---|---|
| *G11C 7/06* | (2006.01) |
| *G11C 11/4074* | (2006.01) |
| *G11C 11/4091* | (2006.01) |
| *G11C 11/4094* | (2006.01) |

(52) U.S. Cl.
CPC ...... *G11C 11/4091* (2013.01); *G11C 11/4074* (2013.01); *G11C 11/4094* (2013.01)

(58) Field of Classification Search
CPC ............ G11C 11/4091; G11C 11/4074; G11C 11/4094; G11C 11/401
See application file for complete search history.

(56) References Cited

U.S. PATENT DOCUMENTS

| | | | | |
|---|---|---|---|---|
| 6,477,100 | B2 * | 11/2002 | Takemura | ........... G11C 11/4074 365/207 |
| 6,674,112 | B1 * | 1/2004 | Tadaki | ................ G11C 11/4097 257/E27.081 |
| 7,505,343 | B2 | 3/2009 | Kang | |
| 7,755,963 | B2 * | 7/2010 | Kang | ........................ G11C 7/08 365/207 |
| 2011/0205822 | A1 * | 8/2011 | Kim | ..................... G11C 11/4091 365/207 |

(Continued)

FOREIGN PATENT DOCUMENTS

| | | |
|---|---|---|
| KR | 10-2007-0069756 A | 7/2007 |
| KR | 10-2011-0011832 A | 2/2011 |
| KR | 10-2015-0001396 A | 1/2015 |

*Primary Examiner* — Mushfique Siddique
(74) *Attorney, Agent, or Firm* — Sughrue Mion, PLLC

(57) ABSTRACT

A bitline sense amplifier includes an amplifier circuit having a plurality of PMOS elements and a plurality of NMOS elements, a first switch circuit supplying a first power supply voltage to the plurality of PMOS elements, and a second switch circuit supplying one of a second power supply voltage, lower than the first power supply voltage, a first boost voltage higher than the second power supply voltage, and a second boost voltage, lower than the second power supply voltage, to the plurality of NMOS elements. The second switch circuit sequentially applies the first boost voltage, the second boost voltage, and the second power supply voltage to the plurality of NMOS elements based on an execution of a read operation.

20 Claims, 16 Drawing Sheets

(56)                    References Cited

U.S. PATENT DOCUMENTS

| | | | |
|---|---|---|---|
| 2015/0003146 A1 | 1/2015 | Chun et al. | |
| 2015/0036444 A1* | 2/2015 | Seo | G11C 11/4091 |
| | | | 365/210.1 |
| 2017/0365308 A1* | 12/2017 | Cha | G11C 7/22 |
| 2018/0061461 A1* | 3/2018 | Seo | G11C 7/18 |
| 2019/0237114 A1* | 8/2019 | Won | G11C 11/4091 |
| 2023/0121199 A1* | 4/2023 | Cho | G11C 7/065 |
| | | | 365/185.21 |
| 2023/0377630 A1* | 11/2023 | Cheng | G11C 11/4091 |
| 2024/0170030 A1* | 5/2024 | Xie | G11C 7/08 |

* cited by examiner

BITLINE SENSE AMPLIFIER FOR SETTING A VOLTAGE FOR A MEMORY CELL AND SEMICONDUCTOR DEVICE INCLUDING THE SAME

CROSS-REFERENCE TO RELATED APPLICATION(S)

This application is based on and claims priority under 35 USC 119(a) of Korean Patent Application No. 10-2023-0057643 filed on May 3, 2023 in the Korean Intellectual Property Office, the entire disclosure of which is incorporated herein by reference for all purposes.

BACKGROUND

1. Field

The disclosure relates to a bitline sense amplifier and a semiconductor device including the same.

2. Description of Related Art

A memory device is a semiconductor device capable of storing data and reading stored data. The memory device may include a memory cell array in which memory cells storing data are provided, and a sense amplifier connected to the memory cells to write or read data. The memory device may include other components in additional to memory sell array and the sense amplifier. When data is stored by charging the cell capacitor of each memory cell, the charge of the cell capacitor fluctuates in the process of reading data, and thus, a process of restoring data of a memory cell may be required.

SUMMARY

Example embodiments of the disclosure provide a bitline sense amplifier for accurately writing data into a memory cell and a semiconductor device including the same, by accurately controlling the voltage of a bit line to a target level in an operation of restoring data of a memory cell after a read operation.

According to an aspect of the disclosure, there is provided a bitline sense amplifier including: a first inverter having a first input terminal connected to a bit line and a first output terminal connected to a complementary bit line, the first inverter connected between a first sense enable line and a second sense enable line; a second inverter having a second input terminal connected to the complementary bit line and a second output terminal connected to the bit line, the second inverter connected between the first sense enable line and the second sense enable line; a first switch circuit including a first switch element connected between a first power node and the first sense enable line, the first power node configured to supply a first power supply voltage, and a second switch circuit connected to the second sense enable line, the second switch circuit including: a second switch element connected between a second power node and the second sense enable line, the second power node configured to supply a second power supply voltage lower than the first power supply voltage, a first boosting element connected between a first boosting node and the second sense enable line, the first boosting node configured to supply a first boost voltage higher than the second power supply voltage, and a second boosting element connected between a second boosting node and the second sense enable line, the second boosting node configured to supply a second boost voltage lower than the second power supply voltage.

According to another aspect of the disclosure, there is provided a semiconductor device including: a first inverter and a second inverter connected to a bit line and a complementary bit line; a first switch circuit including a first switch element configured to supply a first power supply voltage to the first inverter and the second inverter through a first sense enable line; a second switch circuit configured to supply at least one of a second power supply voltage, a first boost voltage or a second boost voltage to the first inverter and the second inverter through a second sense enable line, the first boost voltage being higher than the second power supply voltage and lower than the first power supply voltage, and the second boost voltage being lower than the second power supply voltage; and control logic circuit configured to control the first switch circuit and the second switch circuit to execute a control operation on a memory cell connected to one of the bit line or the complementary bit line, wherein, in an operation of completing a sensing operation of reading data stored in the memory cell and a precharging operation of precharging the bit line and the complementary bit line, the control logic circuit is configured to sequentially supply the second boost voltage and the second power supply voltage to the second sense enable line.

According to an aspect of the disclosure, there is provided a bitline sense amplifier including: an amplifier circuit having a plurality of p-channel metal-oxide semiconductor (PMOS) elements and a plurality of n-channel metal-oxide semiconductor (NMOS) elements; a first switch circuit configured to supply a first power supply voltage to the plurality of PMOS elements; and a second switch circuit configured to supply one of a second power supply voltage, a first boost voltage, or a second boost voltage to the plurality of NMOS elements, the second power supply voltage being lower than the first power supply voltage, the first boost voltage being higher than the second power supply voltage, and the second boost voltage being lower than the second power supply voltage, wherein, based on an execution of a read operation, the second switch circuit is configured to sequentially apply the first boost voltage, the second boost voltage, and the second power supply voltage to the plurality of NMOS elements.

BRIEF DESCRIPTION OF DRAWINGS

The above and other aspects, features, and advantages of the disclosure will be more clearly understood from the following detailed description, taken in conjunction with the accompanying drawings, in which.

DETAILED DESCRIPTION

Figure 1:
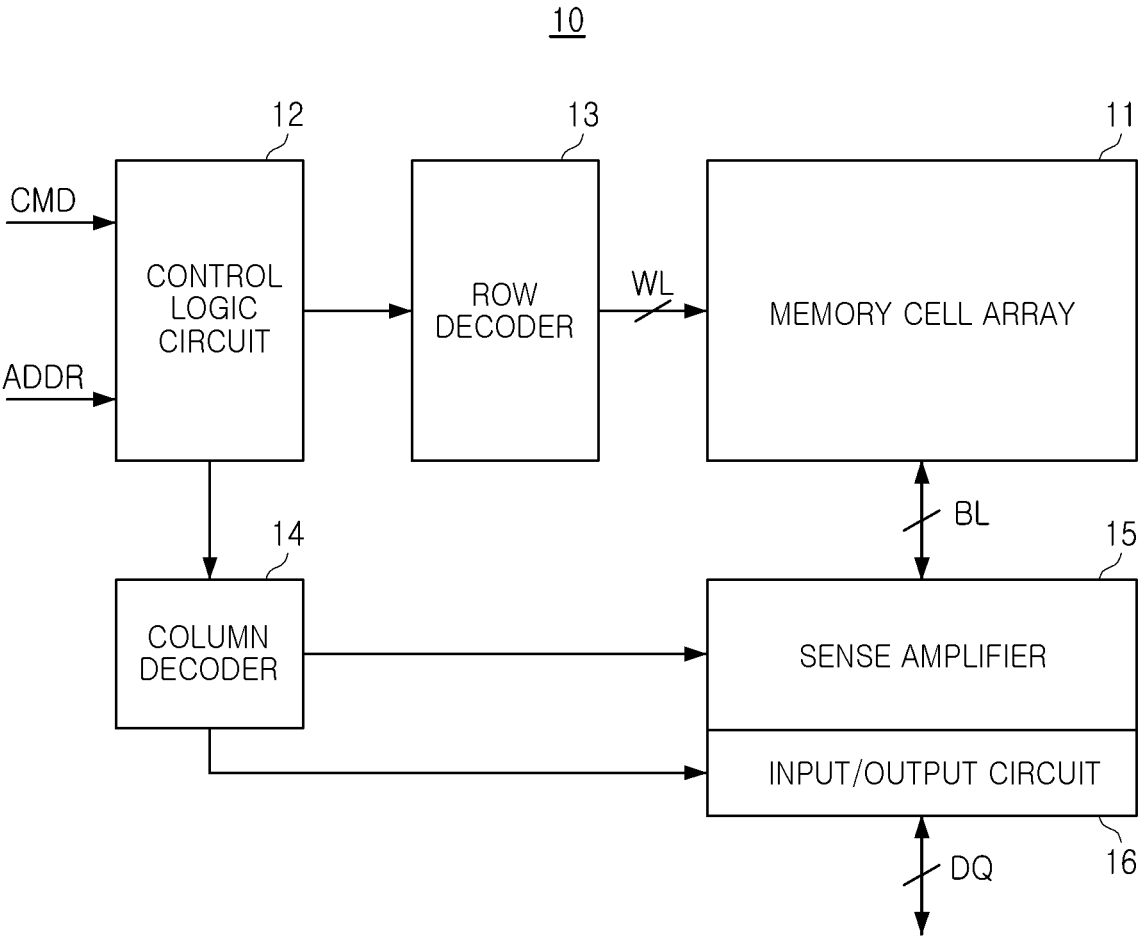
FIG. 1 is a schematic block diagram of a semiconductor device according to an example embodiment.

Hereinafter, example embodiments will be described with reference to the accompanying drawings.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when a component is described as being "connected to," or "coupled to" another component, it may be directly "connected to," or "coupled to" the other component, or there may be one or more other components intervening therebetween. In contrast, when an element is described as being "directly connected to," or "directly coupled to" another element, there can be no other elements intervening therebetween. Likewise, similar expressions, for example, "between" and "immediately between," and "adjacent to" and "immediately adjacent to," are also to be construed in the same way. As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application and are not to be interpreted in an idealized or overly formal sense unless expressly so defined herein. The use of the term "may" herein with respect to an example or embodiment (e.g., as to what an example or embodiment may include or implement) means that at least one example or embodiment exists where such a feature is included or implemented, while all example embodiments are not limited thereto.

The embodiments of the disclosure are example embodiments, and thus, the disclosure is not limited thereto and may be realized in various other forms. As is traditional in the field, embodiments may be described and illustrated in terms of blocks, as shown in the drawings, which carry out a described function or functions. These blocks, which may be referred to herein as units or modules or the like, or by names such as device, logic, circuit, counter, comparator, generator, converter, or the like, may be physically implemented by analog and/or digital circuits including one or more of a logic gate, an integrated circuit, a microprocessor, a microcontroller, a memory circuit, a passive electronic component, an active electronic component, an optical component, and the like, and may also be implemented by or driven by software and/or firmware (configured to perform the functions or operations described herein).

FIG. 1 is a schematic block diagram of a semiconductor device according to an example embodiment.

Referring to FIG. 1, a semiconductor device 10 according to an example embodiment may be a storage device. For example, the storage device may be a semiconductor based storage device. The memory device 10 may be a random access memory (RAM) device such as a Dynamic Random Access Memory (DRAM), a Synchronous DRAM (SDRAM), a Static RAM (SRAM), a Double Date Rate SDRAM (DDR SDRAM), a DDR2 SDRAM, a DDR3 SDRAM, a Phase-change RAM (PRAM), a Magnetic RAM (MRAM), a Resistive RAM (RRAM), or the like. The memory device 10 may store data received through a data signal DQ or may output data as the data signal DQ, based on the address signal ADDR and the control command signal CMD received from an external host. The host may be a central processing unit (CPU), an application processor (AP), or a system on chip (SoC). The memory device 10 may include a memory cell array 11, a control logic circuit 12, a row decoder 13, a column decoder 14, a sense amplifier 15, an input/output (IO) circuit 16. However, the disclosure is not limited thereto, and as such, the memory device 10 may include additional components or omit one or more components illustrated in FIG. 1.

The memory cell array 11 includes a plurality of memory cells, and the plurality of memory cells may be connected to the row decoder 13 and the sense amplifier 15. The plurality of memory cells may be connected to the row decoder 13 through a plurality of word lines WL and the plurality of memory cells may be connected to the sense amplifier 15 through a plurality of bit lines BL. Each of the plurality of memory cells may be positioned at a point at which one of a plurality of word lines WL and one of a plurality of bit lines BL intersect. A plurality of memory cells may be arranged in a matrix form in the memory cell array 11, and each of the plurality of memory cells may include at least one memory device (or a memory element) for storing data. For example, when the memory device 10 is a DRAM, each of the plurality of memory cells may include a switch element and a cell capacitor. However, the disclosure is not limited thereto, and as such, according to another embodiment, another type of memory device 10 may include a different configuration of elements to store data.

The control logic circuit 12 may receive an address signal ADDR and a control command signal CMD from an external host. The address signal ADDR may include a row address indicating a row in the memory cell array 11 and a column address indicating a column in the memory cell array 11. For example, the row decoder 13 selects at least one of the plurality of word lines WL based on the row address, and the column decoder 14 may select at least one of the plurality of bit lines BL based on the column address.

The sense amplifier 15 may include a plurality of bitline sense amplifiers connected to the memory cell array 11 through a plurality of bit lines. For example, when a read operation is executed, a bitline sense amplifier connected to the selected bit line selected by the column decoder 14 may read data from at least one of memory cells connected to the selected bit line. The input/output circuit 16 may output data read by the bitline sense amplifier as a data signal DQ.

Each of the plurality of bitline sense amplifiers may include a plurality of p-channel metal-oxide semiconductor (PMOS) elements, a plurality of n-channel metal-oxide semiconductor (NMOS) elements, and switch devices. A plurality of PMOS elements and a plurality of NMOS elements provide a plurality of inverters, and a plurality of switch elements may determine voltages input to the plurality of inverters.

In the read operation, when the bitline sense amplifier reads data from the selected memory cell connected to the selected bit line, a charge amount of a cell capacitor included in the selected memory cell may vary. In an example case, the charge amount of the cell capacitor included in the selected memory cell may change as a result of the bitline sense amplifier reading data from the selected memory cell. Therefore, data in the selected memory cell may be damaged due to the read operation. To compensate for this, the semiconductor device 10 may perform a restoration operation for rewriting data into the selected memory cell.

The read operation may be performed in such away that a bitline sense amplifier compares voltages of a pair of bit lines, and one of the pair of bit lines may be a selected bit line. Among the pair of bit lines, a bit line maintained at a relatively low voltage level may receive a first boost voltage level higher than a reference voltage level of the semiconductor device 10. The reference voltage level may be a ground voltage level. By inputting the first boost voltage at a level higher than the reference voltage level to the bit line at the low voltage level as described above, the refresh characteristics of the semiconductor device 10 may be improved.

However, in the case of using the first boost voltage as described above in the read operation, an error may occur in an operation of restoring data to a selected memory cell after a read operation and setting a voltage of a pair of bit lines to a target level. In an example embodiment, by inputting the second boost voltage at a level lower than the reference voltage level to at least one of the pair of bit lines after a read operation, an operation of restoring data to the selected memory cell and an operation of setting voltages of bit lines to target levels may be accurately performed. Therefore, the performance and reliability of the semiconductor device 10 may be improved.

Figure 2:
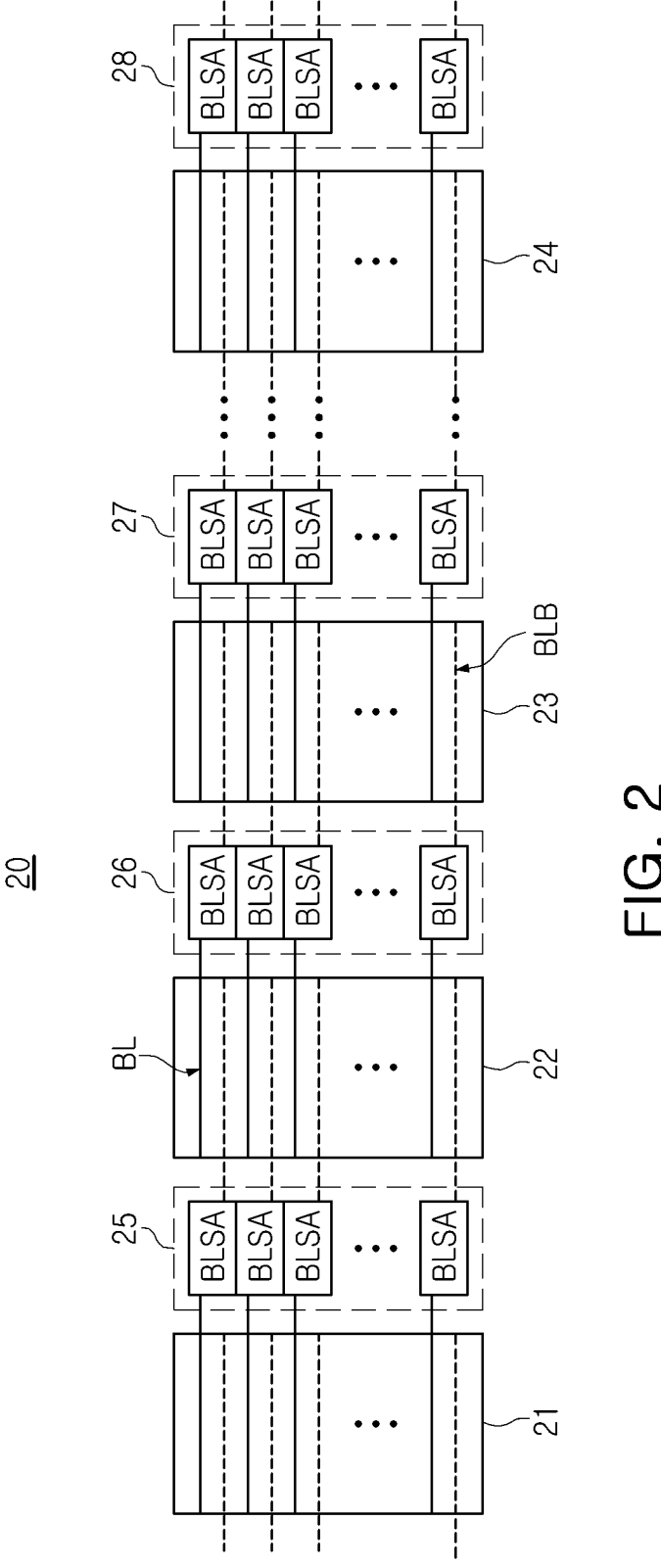
FIGS. 2 and 3 are schematic diagrams illustrating the structure of a semiconductor device according to an example embodiment.
Figure 3:
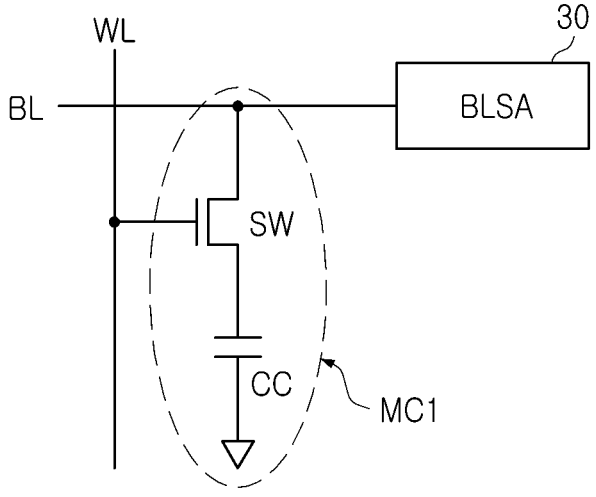

FIGS. 2 and 3 are schematic diagrams illustrating the structure of a memory device according to an example embodiment.

Referring first to FIG. 2, the memory device 20 may include a plurality of sub arrays provided with memory cells, and a plurality of sense amplifiers. For example, the plurality of sub arrays may include a first sub array 21, a second sub array 22, a third sub array 23 and a fourth sub array 24. Moreover, the plurality of sense amplifiers may include a first sense amplifier 25, a second sense amplifier 26, a third sense amplifier 27 and a fourth sense amplifier 28. Each of the plurality of sense amplifiers 25-28 may include a plurality of bitline sense amplifiers BLSA. Although FIG. 2 illustrates four sub arrays and four sense amplifiers, the disclosure is not limited thereto, and as such, according to another embodiment, the number of sub arrays and the number of sense amplifiers may be different than 4.

As illustrated in FIG. 2, memory cells in each of the plurality of sub arrays 21 to 24 are connected to at least one of bit lines BL and complementary bit lines BLB, and each of the plurality of bitline sense amplifiers BLSA may be connected to one of the bit lines BL and one of the complementary bit lines BLB. Accordingly, each of the plurality of bitline sense amplifiers BLSA may be connected to the memory cells in an open bit line manner.

Referring to FIG. 3, one bitline sense amplifier 30 may be connected to a memory cell MC1 through a bit line BL. In an example embodiment, the memory cell MC1 may include a switch element SW and a cell capacitor CC. Data stored in the memory cell MC1 may vary according to the charge amount of the cell capacitor CC. As an example, if the state in which charge is charged in the cell capacitor (CC) is defined as data '1', a state in which charge is not charged in the cell capacitor (CC) may be defined as data '0'.

Figure 4:
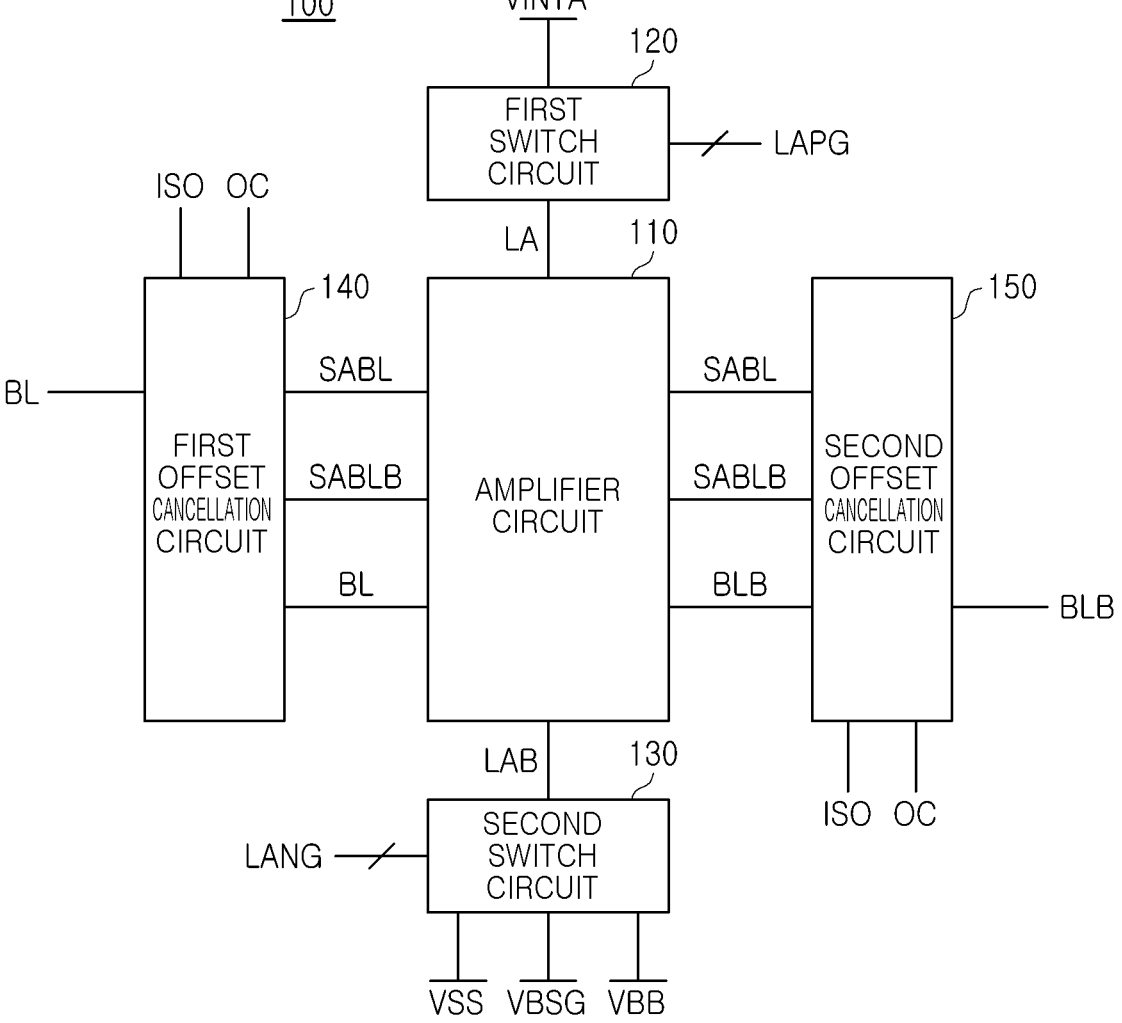
FIG. 4 is a schematic diagram of a bitline sense amplifier according to an example embodiment.

FIG. 4 is a schematic diagram of a bitline sense amplifier according to an example embodiment.

Referring to FIG. 4, the bitline sense amplifier 100 according to an example embodiment may include an amplifier circuit 110, a first switch circuit 120, a second switch circuit 130, a first offset cancellation circuit 140, and a second offset cancellation circuit 150. However, the disclosure is not limited thereto, and as such, according to another embodiment, the bitline sense amplifier 100 may include additional components, omit or combine one or more of components illustrated in FIG. 4. The amplifier circuit 110 is connected to the first offset cancellation circuit 140 through a bit line BL, a sensing bit line SABL, and a complementary sensing bit line SABLB, and the first offset cancellation circuit 140 may be connected to the memory cell through the bit line BL. In addition, the amplifier circuit 110 is connected to the second offset cancellation circuit 150 through a complementary bit line BLB, a sensing bit line SABL, and a complementary sensing bit line SABLB. The second offset cancellation circuit 150 may be connected to the memory cell through the complementary bit line BLB.

The first switch circuit 120 is connected to the amplifier circuit 110 through the first sense enable line LA, and may be connected between a first power node supplying the first power voltage VINTA and the first sense enable line LA.

The first switch circuit 120 includes at least one first switch element. According to an embodiment, the first power voltage VINTA supplied to the first sense enable line LA is controlled by turning the first switch element on or off. Moreover, the first switch element is turned on or off by the first control signal LAPG, and the voltage of the first sense enable line LA may be set to the first power voltage VINTA or floated by the first switch circuit 120.

The second switch circuit 130 may be connected to the amplifier circuit 110 through the second sense enable line LAB. In addition, the second switch circuit 130 may be connected to a second power node for supplying a second power supply voltage (VSS), a first boosting node for supplying a first boost voltage (VBSG), and a second boosting node for supplying a second boost voltage (VBB). According to an embodiment, a plurality of elements may be connected between the second power node, the first boosting node, and the second boosting node, respectively, and the second sense enable line LAB, and turning on or off of the plurality of elements may be determined by the second control signal LANG. According to an embodiment, by controlling the second switch circuit 130, the voltage of the second sense enable line LAB may be set to one of the second power supply voltage VSS, the first boost voltage VBSG, and the second boost voltage VBB, or may be floated.

The first offset cancellation circuit 140 and the second offset cancellation circuit 150 may operate based on a separation control signal ISO and an offset cancellation signal OC. For example, the first offset control circuit 140 may separate the bit line BL and the sensing bit line SABL from each other based on the separation control signal ISO. The bit line BL and the complementary sensing bit line SABLB may be separated from each other based on the offset cancellation signal OC. Similarly, the second offset control circuit 150 may separate the complementary bit line BLB and the complementary sensing bit line SABLB based on the separation control signal ISO, and the complementary bit line BLB and the sensing bit line SABL may be separated from each other based on the offset cancellation signal OC.

The amplifier circuit 110 includes a plurality of PMOS elements and a plurality of NMOS elements. For example, a plurality of PMOS elements and a plurality of NMOS elements may form a plurality of inverters connected to each other. The amplifier circuit 110 may amplify a difference between the voltage of the bit line BL and the voltage of the complementary bit line BLB based on the respective voltages of the first sense enable line LA and the second sense enable line LAB. For example, the amplifier circuit 110 includes a first inverter and a second inverter. Moreover, an input terminal of the first inverter may be connected to the bit line (BL) and an output terminal may be connected to the complementary bit line (BLB), and an input terminal of the second inverter may be connected to the complementary bit line BLB and an output terminal may be connected to the bit line BL.

Figure 5:
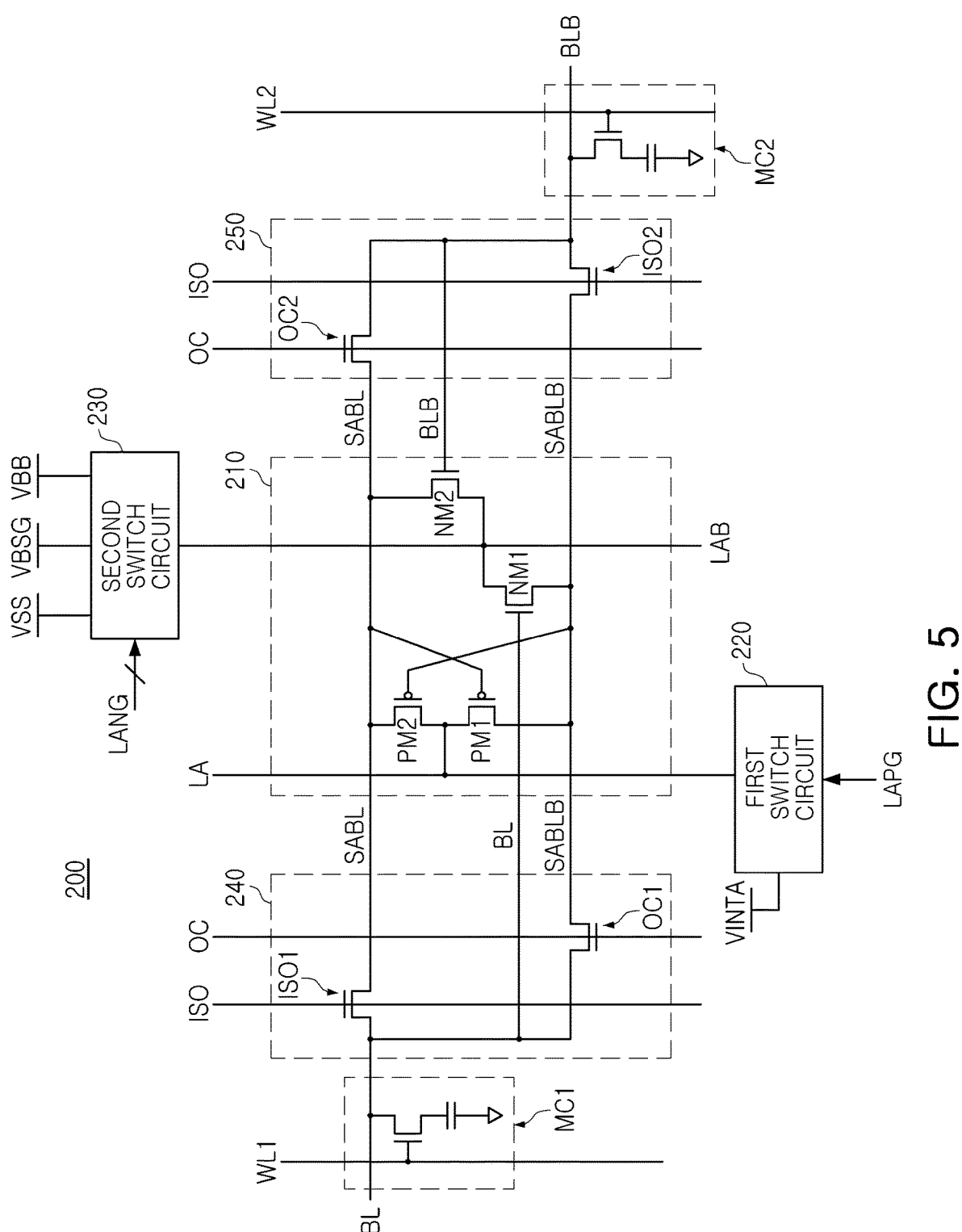
FIGS. 5 and 6 are circuit schematic diagrams illustrating a bitline sense amplifier according to an example embodiment.
Figure 6:
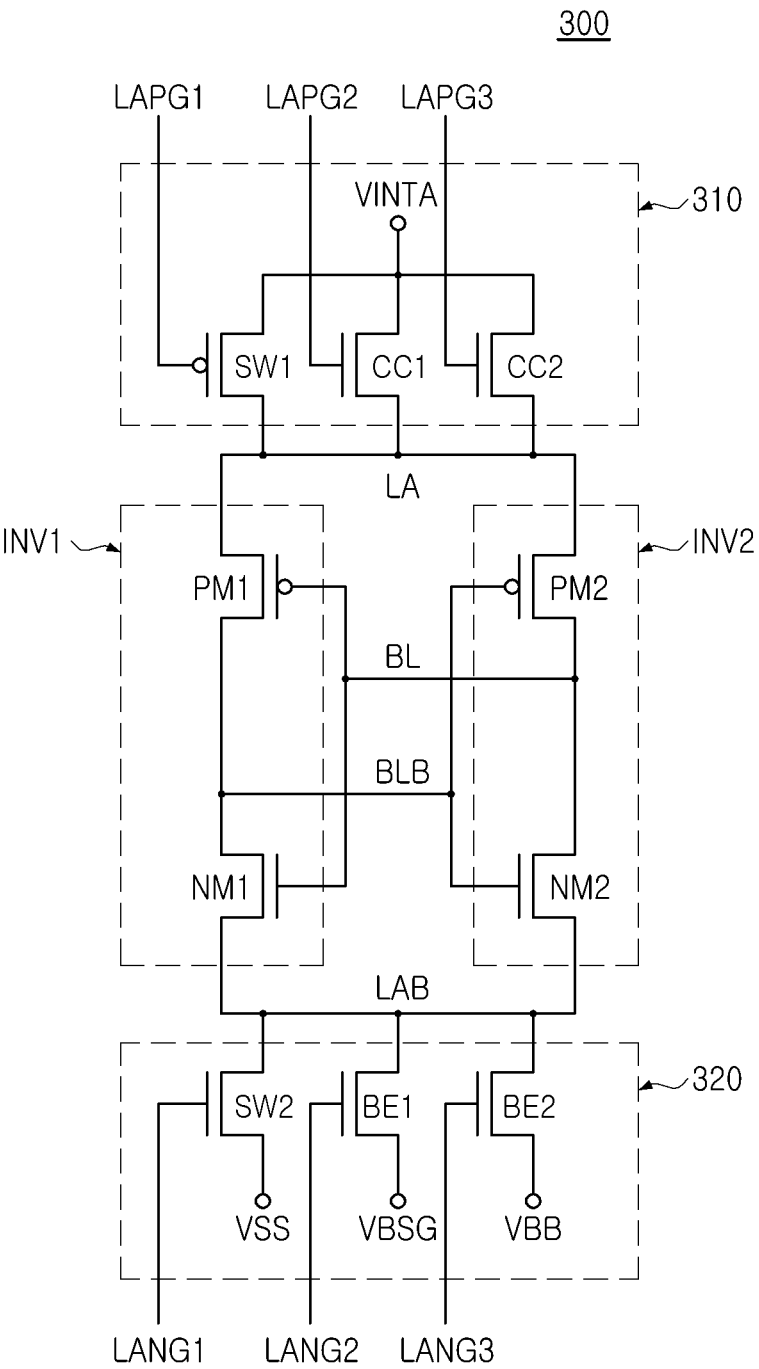

FIGS. 5 and 6 are circuit diagrams schematically illustrating a bitline sense amplifier according to an example embodiment.

Referring to FIG. 5, the bitline sense amplifier 200 may include an amplifier circuit 210, a first switch circuit 220, a second switch circuit 230, a first offset cancellation circuit 240, and a second offset cancellation circuit 250. However, the disclosure is not limited thereto, and as such, according to another embodiment, the bitline sense amplifier 200 may include additional components, omit or combine one or more of components illustrated in FIG. 5. The amplifier circuit 210 may include a plurality of PMOS elements PM1 and PM2 and a plurality of NMOS elements NM1 and NM2. Anode between the plurality of PMOS elements PM1 and PM2 may be connected to the first switch circuit 220 through a first sense enable line LA, and a node between the plurality of NMOS elements NM1 and NM2 may be connected to the second switch circuit 230 through the second sense enable line LAB. According to an embodiment, the plurality of PMOS elements may be PMOS transistors and the plurality of NMOS elements may be NMOS transistors. However, the disclosure is not limited thereto, and as such, other types of transistors or switching element may be provided according to other embodiments.

The first switch circuit 220 may determine whether to supply the first power supply voltage VINTA to the first sense enable line LA, and the second switch circuit 230 may determine whether to supply one of the second power supply voltage VSS, the first boost voltage VBSG, and the second boost voltage VBB to the second sense enable line LAB. The first switch circuit 220 may operate based on the first control signal LAPG, and the second switch circuit 230 may operate based on the second control signal LANG.

The amplifier circuit 210 may be connected to the bit line BL through the first offset cancellation circuit 240 and the amplifier circuit 210 may be connected to the complementary bit line BLB through the second offset cancellation circuit 350. In an example embodiment, the first memory cell MC1 connected to the bit line BL and the first word line WL1 may be provided in a different sub-array from the second memory cell MC2 connected to the complementary bit line BLB and the second word line WL. Each of the first memory cell MC1 and the second memory cell MC2 may include a switch element SW and a cell capacitor CC.

The first PMOS element PM1 may be connected between the first sense enable line LA and the complementary sensing bit line SABLB. The second PMOS element PM2 may be connected between the first sense enable line LA and the sensing bit line SABL. A gate of the first PMOS element PM1 is connected to the sensing bit line SABL. A gate of the second PMOS element PM2 may be connected to the complementary sensing bit line SABLB.

The first NMOS element NM1 may be connected between the second sense enable line LAB and the complementary sensing bit line SABLB. The second NMOS element NM2 may be connected between the second sense enable line LAB and the sensing bit line SABL. A gate of the first NMOS element NM1 may be connected to the bit line BL, and a gate of the second NMOS element NM2 may be connected to the complementary bit line BLB.

The first offset cancellation circuit 240 may include a first offset element OC1 and a first separation element ISO1. The first offset element OC1 is connected between the bit line BL and the complementary sensing bit line SABLB, and accordingly, the bit line BL and the complementary sensing bit line SABLB may be connected to or separated from each other by the first offset element OC1. The first separation element ISO1 may be connected between the bit line BL and the sensing bit line SABL. Accordingly, the bit line BL and the sensing bit line SABL may be connected or separated from each other by turning on or off the first separation element ISO1. The first offset element OC1 may be controlled by the offset cancellation signal OC, and the first separation element ISO1 may be controlled by the separation control signal ISO.

The second offset cancellation circuit 250 may include a second offset element OC2 and a second separation element ISO2. The second offset element OC2 is connected between the complementary bit line BLB and the sensing bit line SABL. The complementary bit line BLB and the sensing bit line SABL may be connected to or separated from each other by the second offset element OC2. The second separation element ISO2 may be connected between the complementary bit line BLB and the complementary sensing bit line SABLB. Accordingly, the complementary bit line BLB and the complementary sensing bit line SABLB may be connected or separated from each other by turning on or off the second separation element ISO2. The second offset element OC2 is controlled by the offset cancellation signal OC. The second separation element ISO2 may be controlled by the separation control signal ISO. According to an embodiment, the first offset element OC1, the first separation element ISO1, the second offset element OC2, and/or the second separation element ISO2 may be transistors. However, the disclosure is not limited thereto, and as such, other types of transistors or switching element may be provided according to other embodiments.

Referring to FIG. 6, the bitline sense amplifier 300 may include a first inverter INV1, a second inverter INV2, a first switch circuit 310 and a second switch circuit 320. The first inverter INV1 includes a first PMOS element PM1 and a first NMOS element NM1, and the second inverter INV2 may include a second PMOS element PM2 and a second NMOS element NM2. Each of the first inverter INV1 and the second inverter INV2 may be connected between the first sense enable line LA and the second sense enable line LAB.

An input terminal of the first inverter INV1 may be connected to the bit line BL, and an output terminal may be connected to the complementary bit line BLB. On the other hand, an input terminal of the second inverter INV2 may be connected to the complementary bit line BLB, and an output terminal may be connected to the bit line BL. Accordingly, the input terminal of the first inverter INV1 may be connected to the output terminal of the second inverter INV2, and the output terminal of the first inverter INV1 may be connected to the input terminal of the second inverter INV2.

The first switch circuit 310 may include a plurality of elements SW1, CC1, and CC2 connected in parallel between a first power node supplying the first power voltage VINTA and the first sense enable line LA. For example, the first switch circuit 310 may include a first switch element SW1 and current control elements CC1 and CC2. The first switch element SW1 is implemented as a PMOS transistor and may be turned on or off by the first control signal LAPG1. On the other hand, each of the current control elements CC1 and CC2 is implemented as an NMOS transistor, the first current control element CC1 is turned on or off by the first current control signal LAPG2, and the second current control element CC2 may be turned on or off by the second current control signal LAPG3.

The voltage of the first sense enable line LA may be set to the first power supply voltage VINTA as the first switch element SW1 is turned on. On the other hand, if necessary, turning on or off of the current control elements CC1 and CC2 may be selected to adjust the amount of current supplied to the first sense enable line LA.

The second switch circuit 320 may include a plurality of elements SW2, BE1, and BE2. The second switch element SW2 is turned on or off by the second control signal LANG1 and may be connected between a second power node supplying the second power voltage VSS and the second sense enable line LAB. The second power voltage VSS has a lower voltage level than the first power voltage VINTA, and may have, for example, a reference voltage level. According to an example embodiment, the second switch element SW2 may include a plurality of elements connected in parallel between the second power node and the second sense enable line LAB. However, the disclosure is not limited thereto, and as such, the configuration and/or the arrangement of the plurality of elements may be different.

According to an embodiment, the first boosting element BE1 may be turned on or off by the first boosting signal LANG2 and may be connected between the first boosting node supplying the first boost voltage VBSG and the second sense enable line LAB. The first boost voltage VBSG may have a voltage level higher than the second power voltage VSS and lower than the first power voltage VINTA. For example, the first boost voltage VBSG may have a voltage level lower than half of the first power supply voltage VINTA.

According to an embodiment, the second boosting element BE2 may be turned on or off by the second boosting signal LANG3 and may be connected between the second boosting node supplying the second boost voltage VBB and the second sense enable line LAB. The second boost voltage VBB may have a lower voltage level than the second power supply voltage VSS. For example, when the second power supply voltage VSS has a ground voltage level, the second power supply voltage VSS may have a negative voltage level. In an example embodiment, a voltage level difference between the second boost voltage VBB and the second power supply voltage VSS may be greater than a voltage level difference between the first boost voltage VBSG and the second power supply voltage VSS.

Figure 7:
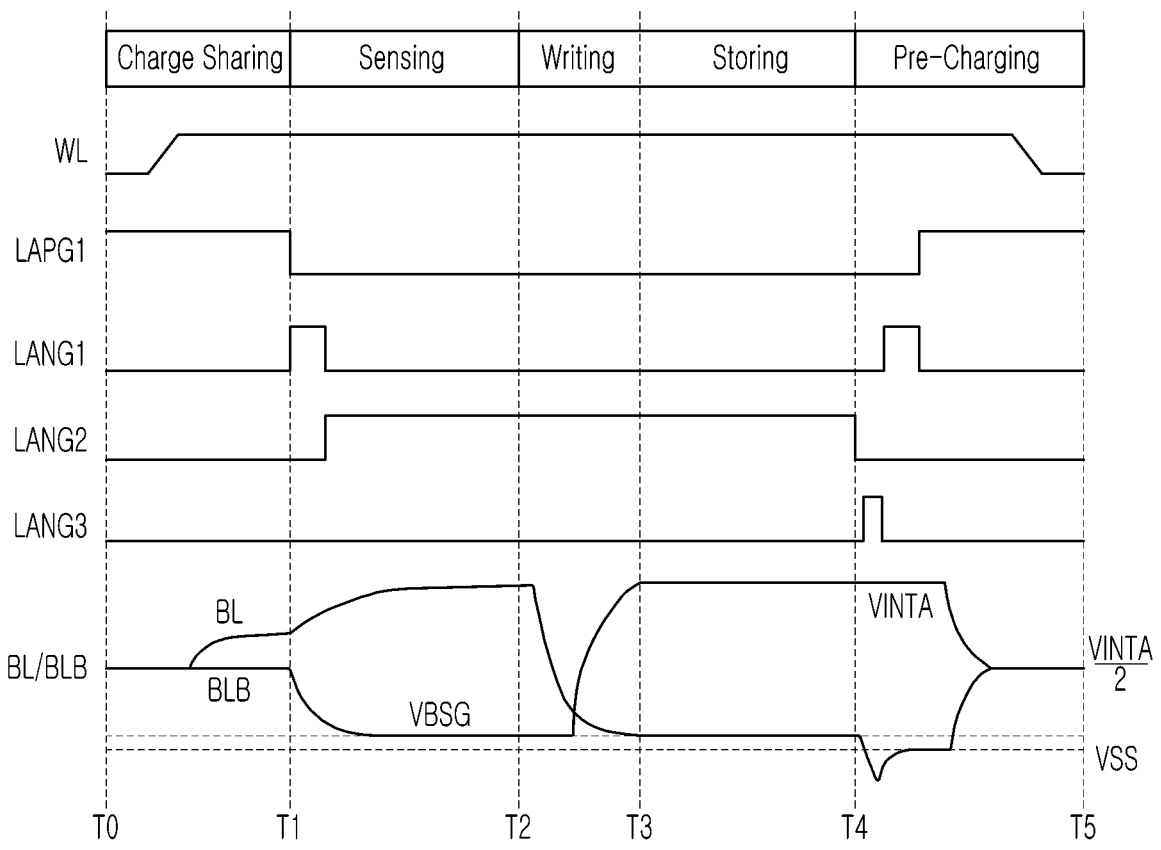
FIGS. 7 and 8 are diagrams provided to describe the operation of the semiconductor device according to an example embodiment.
Figure 8:
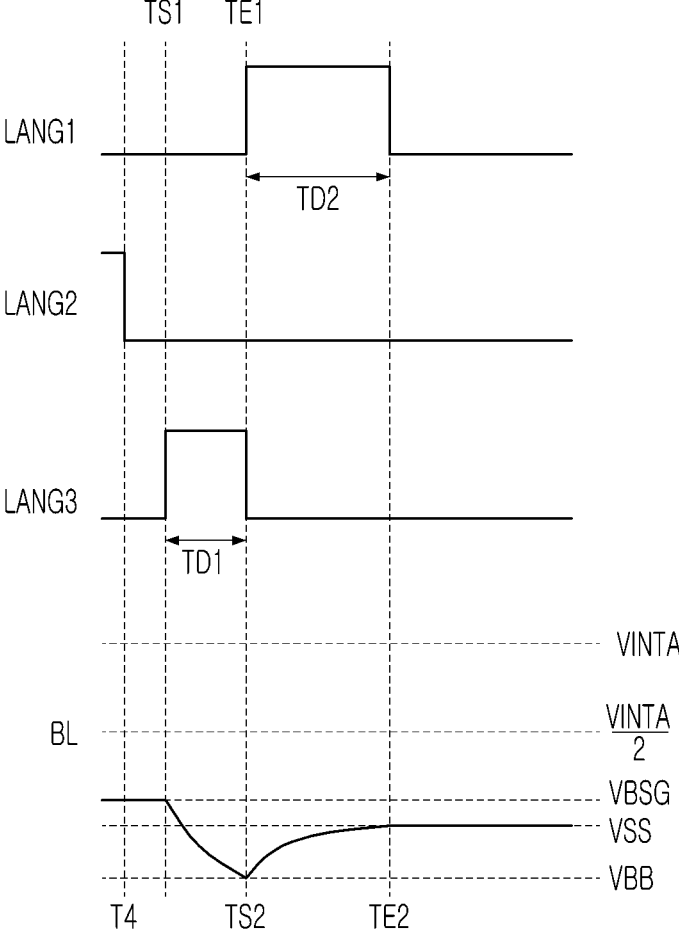

FIGS. 7 and 8 are views provided to explain the operation of the semiconductor device according to an example embodiment.

Hereinafter, the operation of the semiconductor device will be described with reference to FIGS. 7 and 8, and the bitline sense amplifier 300 illustrated in FIG. 6 will also be referred to for convenience of explanation.

According to an embodiment, a read operation of the semiconductor device may start with a charge sharing operation. At the start point T0 when the charge sharing operation starts, the voltage of each of the bit line BL to which the bitline sense amplifier is connected and the complementary bit line BLB may be half of the first power supply voltage VINTA. Referring to FIG. 7, as the voltage of the word line WL connected to the selected memory cell increases in the charge sharing operation, the switch element included in the selected memory cell is turned on. A cell capacitor included in the selected memory cell may be connected to the bit line BL.

When the cell capacitor is connected to the bit line BL, the voltage of the bit line BL may change according to data stored in the selected memory cell. In the example embodiment illustrated in FIG. 7, assuming that data '1' is stored in a selected memory cell, the voltage of the bit line BL may increase due to the charge stored in the cell capacitor.

When the first switch element SW1 and the second switch element SW2 are turned on by the first control signal LAPG1 and the second control signal LANG1 at the first time point T1, The first power voltage VINTA may be supplied to the first sense enable line LA, and the second power voltage VSS may be supplied to the second sense enable line LAB. However, unlike the first switch element SW1 maintaining the turn-on state, the second switch element SW2 may be turned off after maintaining the turn-on state for a relatively short time. When the second switch element SW2 is turned off, the first boosting element BE1 is turned on by the first boosting signal LANG2. Accordingly, the first boost voltage VBSG may be supplied to the second sense enable line LAB.

As the first power supply voltage VINTA is supplied to the first sense enable line LA, the second PMOS element PM2 is turned on. Accordingly, the voltage of the bit line BL may increase to the first power voltage VINTA. On the other hand, as the first boost voltage VBSG is supplied to the second sense enable line LAB, the first NMOS element NM1 is turned on. The voltage of the complementary bit line BLB may decrease to the first boost voltage VBSG. The bitline sense amplifier 300 may amplify and output a voltage difference between the bit line BL and the complementary bit line BLB.

When the sensing operation ends, a writing operation for rewriting data into the selected memory cell may be executed from the second time point T2. As illustrated in FIG. 7, the voltages of the bit line BL and the complementary bit line BLB are inverted. Accordingly, the voltage of the bit line BL may decrease to the first boost voltage VBSG, and the voltage of the complementary bit line BLB may increase to the first power supply voltage VINTA. When the voltages of the bit line BL and the complementary bit line BLB are inverted, the storage operation may be performed from the third time point T3 to the fourth time point T4. A write operation and a store operation may be defined as a restore operation for re-storing charge lost in a cell capacitor of a memory cell due to a read operation.

However, as illustrated in FIG. 7, the voltage of the bit line BL may decrease only to the first boost voltage VBSG instead of the second power supply voltage VSS. Therefore, to accurately store the existing data again in the selected memory cell through the bit line BL, it is necessary to reduce the voltage of the bit line BL to the second power supply voltage VSS lower than the first boost voltage VBSG.

In an example embodiment, by turning on the second boosting element BE2 and inputting the second boost voltage VBB lower than the second power supply voltage VSS to the second sense enable line LAB, the voltage of the bit line BL may be rapidly decreased. Referring to FIG. 7, after the first boosting element BE1 is turned on by the first boosting signal LANG2 at a fourth time point T4 when the precharge operation starts, the second boosting element BE2 may be turned on by the second boosting signal LANG3.

As the second boosting element BE2 is turned on, the second boost voltage VBB lower than the second power supply voltage VSS may be supplied to the second sense enable line LAB. The voltage of the bit line BL is rapidly decreased by the second boost voltage VBB, and for example, may decrease to a negative level lower than the second power supply voltage VSS. When the second boosting element BE2 is turned off again, the second switch element SW2 is turned on by the second control signal LANG1, the voltage of the bit line BL may be stabilized to the second power supply voltage VSS.

Thereafter, the first sense enable line LA and the second sense enable line LAB are floated, and the bit line BL and the complementary bit line BLB may be connected to each other. Therefore, as illustrated in FIG. 7, at the fifth time point T5 when the precharge operation is completed, a voltage of each of the bit line BL and the complementary bit line BLB may be set to half of the first power supply voltage VINTA (e.g., VINTA/2). On the other hand, after the voltage of each of the bit line BL and the complementary bit line BLB is set to half of the first power supply voltage VINTA, as the voltage of the word line WL decreases, the switch element of the selected memory cell may be turned off.

FIG. 8 may be an enlarged view of a timing diagram of some signals during a precharge operation period in the example embodiment described with reference to FIG. 7. Referring to FIG. 8, after the first boosting signal LANG2 transitions at a fourth time point T4 and the first boosting element BE1 is turned off, the second boosting element BE2 may be turned on by the second boosting signal LANG3 during the first time period TD1. As the second boosting element BE2 is turned on, the second boost voltage VBB lower than the second power supply voltage VSS is supplied to the second sense enable line LAB. Accordingly, the voltage of the bit line BL may rapidly decrease during the first time period TD1.

In the example embodiment illustrated in FIG. 8, the voltage of the bit line BL decreases to the second boost voltage VBB during the first time TD1, but the disclosure is not limited in this manner. For example, at the end point TE1 of the first time period TD1, the voltage of the bit line BL may be lower than the second power supply voltage VSS and higher than the second boost voltage VBB. On the other hand, the start time point TS1 of the first time TD1 may be later than the fourth time point T4 at which the first boosting element BE1 is turned off.

When the first time period (TD1) elapses, the second switch element (SW2) is turned on by the second control signal (LANG1) during the second time period (TD2), and the second power supply voltage VSS may be supplied to the second sense enable line LAB. Accordingly, as illustrated in FIG. 8, the voltage of the bit line BL may converge to the second power supply voltage VSS during the second time period TD2. In the example embodiment illustrated in FIG. 8, the start time point TS2 of the second time period TD2 may be the same as the end time point TE1 of the first time period TD1. The second time period TD2 may be set longer than the first time period TD1. On the other hand, the time from the fourth time point T4 to the end time point TE2 of the second time point TD2 may be 10 ns or less.

As described with reference to FIGS. 7 and 8, in an example embodiment, after a sensing operation is completed in a read operation, in the precharge operation, the second boost voltage VBB lower than the second power supply voltage VSS may be input to the second sense enable line LAB. Therefore, the voltage of the bit line BL may be set close to the second power supply voltage VSS instead of the first boost voltage VBSG. The cell capacitor may be sufficiently charged with an electric charge corresponding to data stored in the selected memory cell. Also, after the precharge operation is completed, the voltages of the bit line BL and the complementary bit line BLB may be accurately set to ½ times the first power supply voltage VINTA.

Figure 9:
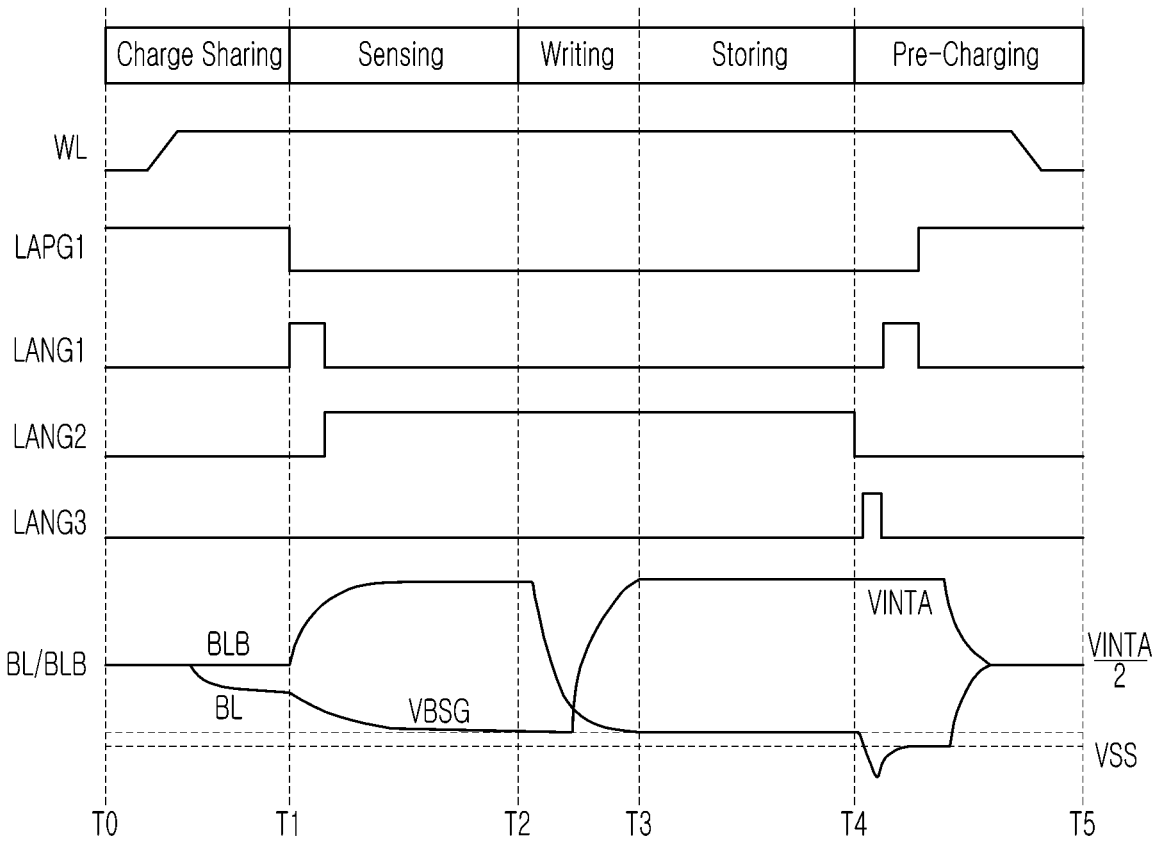
FIG. 9 is a diagram provided to describe an operation of a semiconductor device according to an example embodiment.

FIG. 9 is a diagram provided to describe an operation of a semiconductor device according to an example embodiment.

Hereinafter, for convenience of description, the bitline sense amplifier 300 illustrated in FIG. 6 will be referred to together.

According to an embodiment, a read operation of the semiconductor device may start with a charge sharing operation. As the voltage of the word line WL connected to the selected memory cell increases and the switch element is turned on, a cell capacitor may be connected to the bit line BL. In the example embodiment illustrated in FIG. 9, it is assumed that data '0' is stored in the selected memory cell. Accordingly, the voltage of the bit line BL may decrease below ½ times the initial level of the first power supply voltage VINTA.

When the first switch element SW1 and the second switch element SW2 are turned on by the first control signal LAPG1 and the second control signal LANG1 at the first time point T1, the first sense is enabled. The first power voltage VINTA is supplied to the line LA, and the second power supply voltage VSS may be supplied to the second sense enable line LAB. The second switch element (SW2) is turned off after maintaining the turn-on state for a relatively short time, and as the first boosting element BE1 is turned on by the first boosting signal LANG2, the first boost voltage VBSG may be supplied to the second sense enable line LAB.

In the example embodiment illustrated in FIG. 9, the first PMOS element PM1 and the second NMOS element NM1 may be turned on. Accordingly, the voltage of the bit line BL may decrease to the first boost voltage VBSG, and the voltage of the complementary bit line BLB may increase to the first power supply voltage VINTA. The bitline sense amplifier 300 may amplify and output a voltage difference between the bit line BL and the complementary bit line BLB.

When the sensing operation ends, a writing operation for rewriting data into the selected memory cell may be executed from the second time point T2. As illustrated in FIG. 9, the voltages of the bit line BL and the complementary bit line BLB are inverted, and the voltage of the bit line BL may increase to the first power supply voltage VINTA and the voltage of the complementary bit line BLB may decrease to the first boost voltage VBSG. When the voltages of the bit line BL and the complementary bit line BLB are inverted, the storage operation may be performed from the third time point T3 to the fourth time point T4. A write operation and a store operation may be defined as a restore operation for re-storing charge lost in a cell capacitor of a memory cell due to a read operation.

Referring to FIG. 9, before the switch element of the selected memory cell is turned off by the word line WL, the second boosting element BE2 may be turned on by the second boosting signal LANG3. A second boost voltage VBB lower than the second power supply voltage VSS may be supplied to the second sense enable line LAB while the second boosting element BE2 is turned on. Therefore, in the precharge operation, the voltage of the complementary bit line BLB may decrease to the second power supply voltage VSS instead of the first boost voltage VBSG. At the fifth time point T5, the voltages of the bit line BL and the complementary bit line BLB may be accurately set to ½ times the first power supply voltage VINTA.

Figure 10:
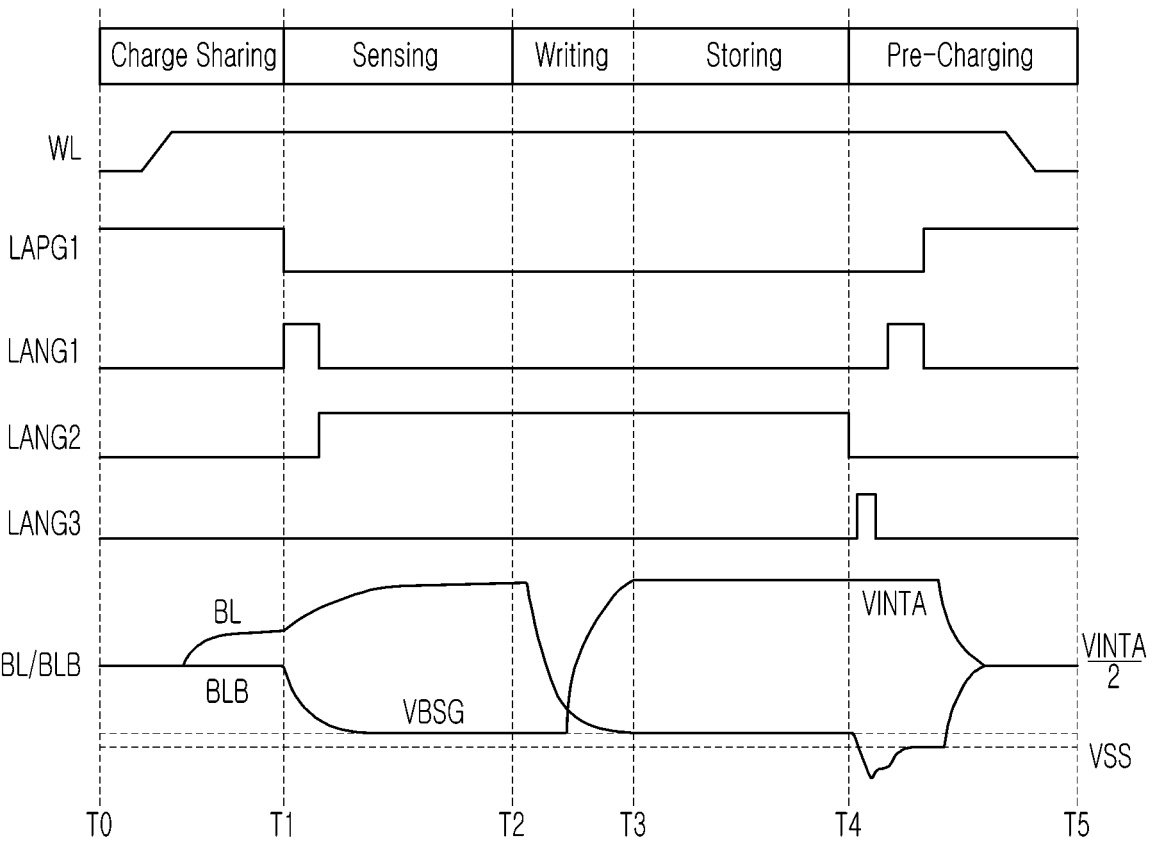
FIGS. 10 and 11 are diagrams provided to explain the operation of the semiconductor device according to an example embodiment.
Figure 11:
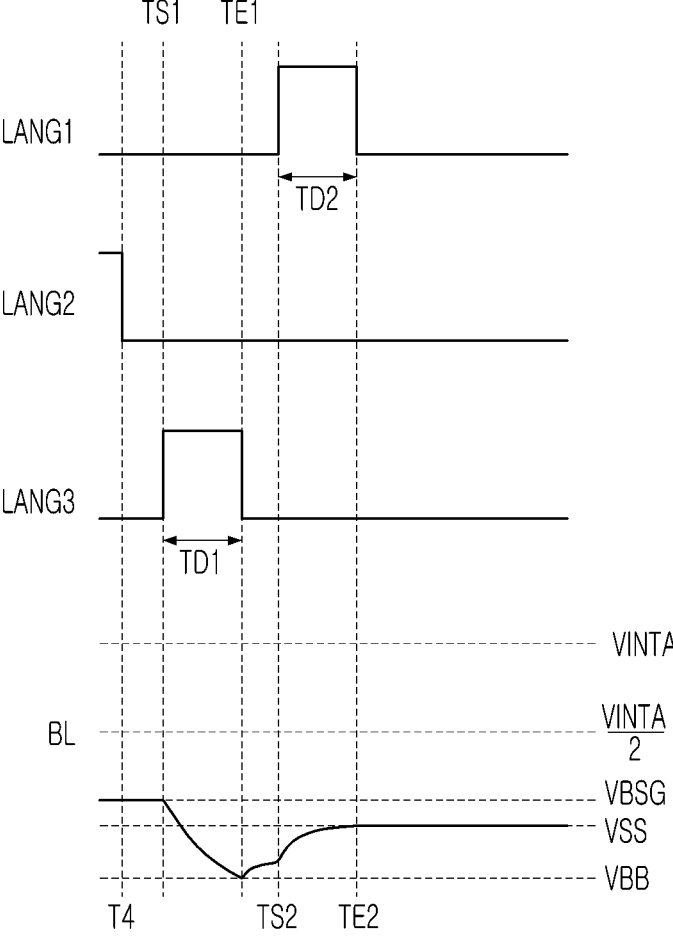

FIGS. 10 and 11 are diagrams provided to explain the operation of the semiconductor device according to an example embodiment.

Hereinafter, for convenience of description, the bitline sense amplifier 300 illustrated in FIG. 6 will also be referred to. As the voltage of the word line WL increases after the starting point T0, the switch element of the selected memory cell is turned on and the cell capacitor may be connected to the bit line BL. In an example embodiment of FIGS. 10 and 11, as the cell capacitor is connected to the bit line BL, the voltage of the bit line BL may increase higher than the initial level.

When the first switch element SW1 and the second switch element SW2 are turned on at the first time point T1, the first power supply voltage VINTA is supplied to the first sense enable line LA, and The second power supply voltage VSS may be supplied to the second sense enable line LAB. The voltage of the second sense enable line LAB may be set to the first boost voltage VBSG as the first boosting element BE1 is turned on. Accordingly, the voltage of the bit line BL may increase to the first power supply voltage VINTA, and the voltage of the complementary bit line BLB may decrease to the first boost voltage VBSG. The bitline sense amplifier 300 amplifies and outputs a voltage difference between the bit line BL and the complementary bit line BLB, and since the voltage of the bit line BL is higher than the voltage of the complementary bit line BLB, the data of the selected memory cell may be read as '1'.

When the sensing operation ends, a write operation and a storage operation for rewriting data in the selected memory cell may be executed after the second point in time T2. After the second point in time T2, the voltages of the bit line BL and the complementary bit line BLB are inverted for a restore operation, and at the third time point T3, the voltage of the bit line BL decreases to the first boost voltage VBSG. The voltage of the complementary bit line BLB may increase up to the first power supply voltage VINTA.

In the precharge operation after the fourth time point T4, an operation for reducing the voltage of the bit line BL to the second power supply voltage VSS lower than the first boost voltage VBSG may be performed. Referring to FIG. 11 illustrating an enlarged timing diagram of signals in a precharge operation, at the fourth time point T4, the first boosting signal LANG2 transitions and the first boosting element BE1 is turned off. During the first time period TD1, the second boosting element BE2 may be turned on by the second boosting signal LANG3. As the second boosting element BE2 is turned on, the second boost voltage VBB lower than the second power supply voltage VSS is supplied to the second sense enable line LAB. Accordingly, the voltage of the bit line BL may rapidly decrease during the first time period TD1.

In the example embodiment illustrated in FIG. 11, it is illustrated that the voltage of the bit line BL decreases to the second boost voltage VBB during the first time period TD1, but the disclosure is not limited in this manner. For example, at the end point TE1 of the first time period TD1, the voltage of the bit line BL may be lower than the second power supply voltage VSS and higher than the second boost voltage VBB. The start time point TS1 of the first time TD1 may be later than the fourth time point T4 at which the first boosting element BET is turned off.

When the first time period (TD1) elapses, the second switch element (SW2) is turned on by the second control signal (LANG1) during the second time period (TD2), and the second power supply voltage VSS may be supplied to the second sense enable line LAB. Accordingly, as illustrated in FIG. 11, the voltage of the bit line BL may converge to the second power supply voltage VSS during the second time period TD2.

In the example embodiment illustrated in FIG. 11, the start time TS2 of the second time TD2 may be later than the end time TE1 of the first time TD1. In detail, during the time between the first time TD1 and the second time TD2, the second switch element SW2, the first boosting element BET, and the second boosting element BE2 are all turned off, and the second sense enable line LAB and the bit line BL may be floated. For example, compared to the example embodiment illustrated in FIG. 8, power consumption may be relatively reduced by setting the time for the second sense enable line LAB to float after the first time TD1. A time from the fourth time point T4 at which the first boosting signal LANG2 transitions to the end time point TE2 of the second time TD2 may be 10 ns or less.

Figure 12:
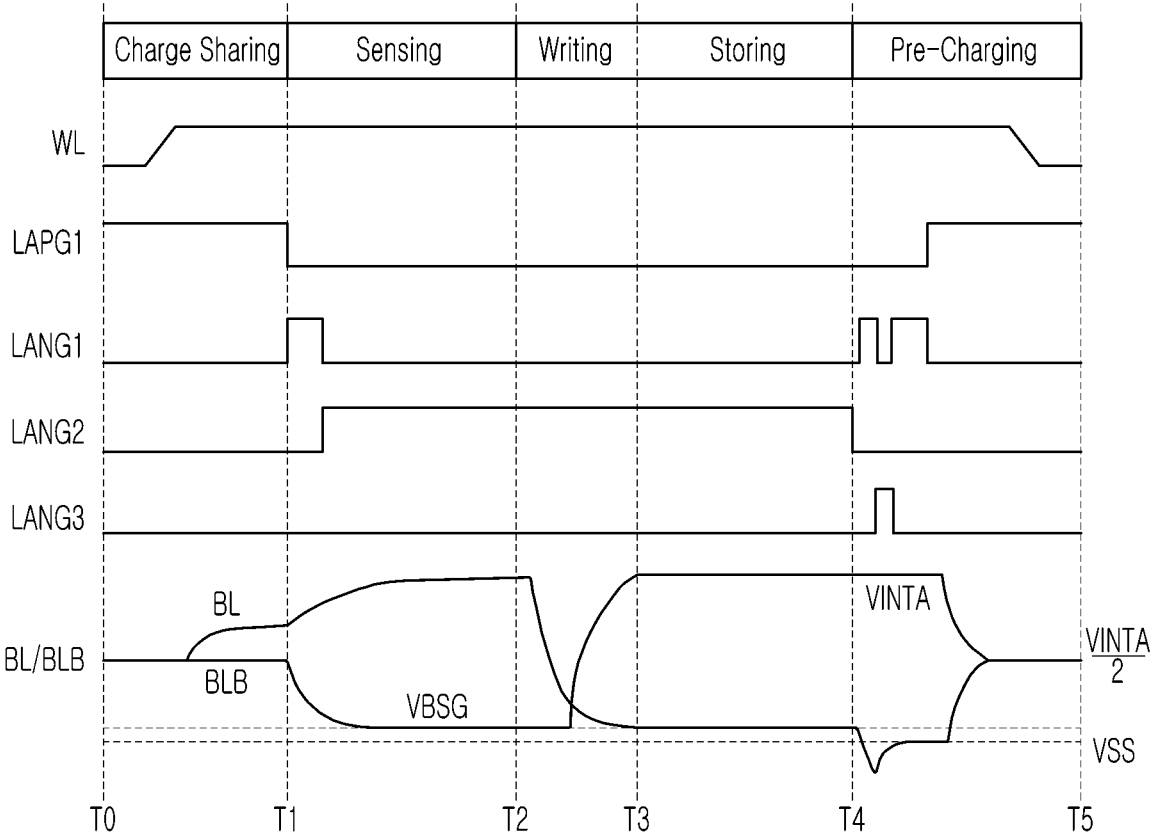
FIGS. 12 and 13 are diagrams provided to explain the operation of the semiconductor device according to an example embodiment.
Figure 13:
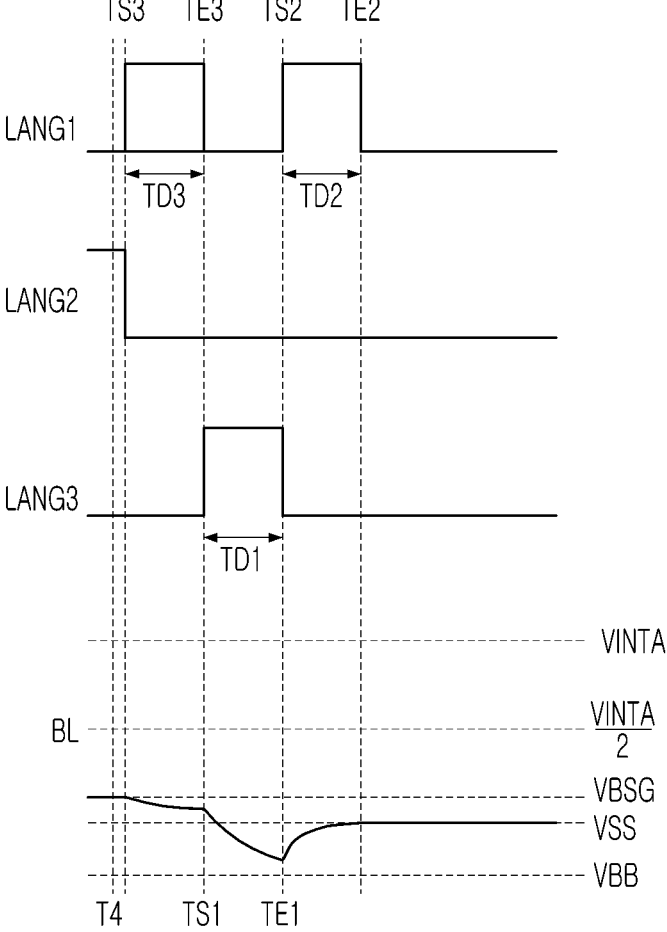

FIGS. 12 and 13 are diagrams provided to explain the operation of a semiconductor device according to an example embodiment.

Hereinafter, for convenience of description, the bitline sense amplifier 300 illustrated in FIG. 6 will also be referred to. A charge sharing operation, a sensing operation, and a storage operation of the bitline sense amplifier 300 may be similar to those described above with reference to FIG. 11.

In the precharge operation after the fourth time point T4, an operation for reducing the voltage of the bit line BL to the second power supply voltage VSS lower than the first boost voltage VBSG may be performed. Referring to FIG. 13 illustrating an enlarged timing diagram of signals in the precharge operation, at a fourth time point T4, the first boosting signal LANG2 transitions and the first boosting element BE1 is turned off. First, the second switch element SW2 may be turned on by the second control signal LANG2. During the third time period TD3 when the second switch element SW2 is turned on, the second power supply voltage VSS may be input to the second sense enable line LAB and the bit line BL. The start time point TS3 of the third time period TD3 may be later than the fourth time point T4.

When the third time TD3 elapses, the second boosting element BE2 may be turned on by the second boosting signal LANG3 during the first time TD1. As the second boosting element BE2 is turned on, the second boost voltage VBB lower than the second power supply voltage VSS is supplied to the second sense enable line LAB. Accordingly, the voltage of the bit line BL may rapidly decrease during the first time period TD1.

The first time TD1 may be substantially the same as the third time TD3. However, according to embodiments, the first time period TD1 and the third time period TD3 may be different from each other. On the other hand, FIG. 13 shows that the end time TE3 of the third time TD3 coincides with the start time TS1 of the first time TD1. However, the disclosure is not limited thereto, and as such, according to another embodiment, the start time TS1 of the first time TD1 may be later than the end time TE3 of the third time TD3. Also, it is illustrated that the voltage of the bit line BL decreases to a voltage level between the second power supply voltage VSS and the second boost voltage VBB during the first time period TD1, but the disclosure is not limited in this manner. For example, at the end point TE1 of the first time period TD1, the voltage of the bit line BL may be equal to the second boost voltage VBB.

When the first time period (TD1) elapses, the second switch element (SW2) is turned on by the second control signal (LANG1) during the second time period (TD2), and the second power supply voltage VSS may be supplied to the second sense enable line LAB. Accordingly, as illustrated in FIG. 11, the voltage of the bit line BL may converge to the second power supply voltage VSS during the second time period TD2. The time from the fourth time point T4 to the end time point TE2 of the second time period TD2 may be 10 ns or less.

Figure 14:
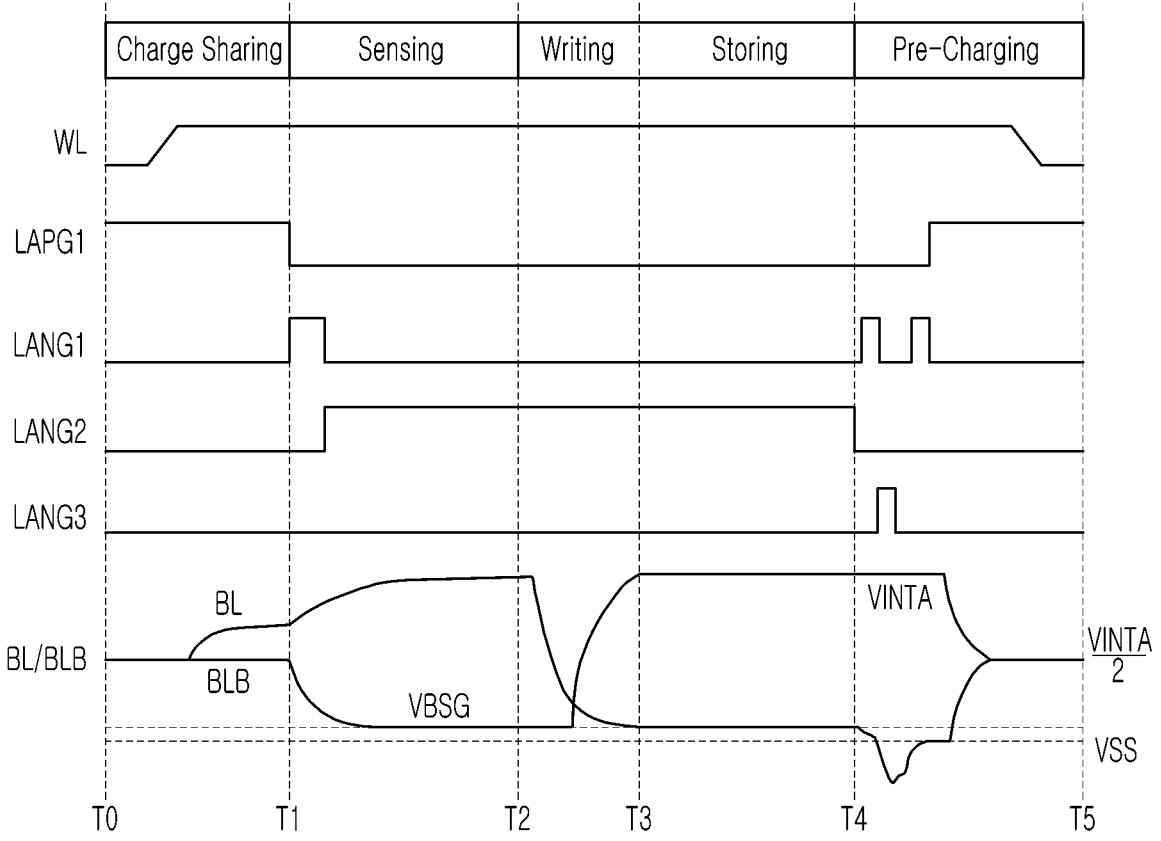
FIGS. 14 and 15 are diagrams provided to explain the operation of the semiconductor device according to an example embodiment.
Figure 15:
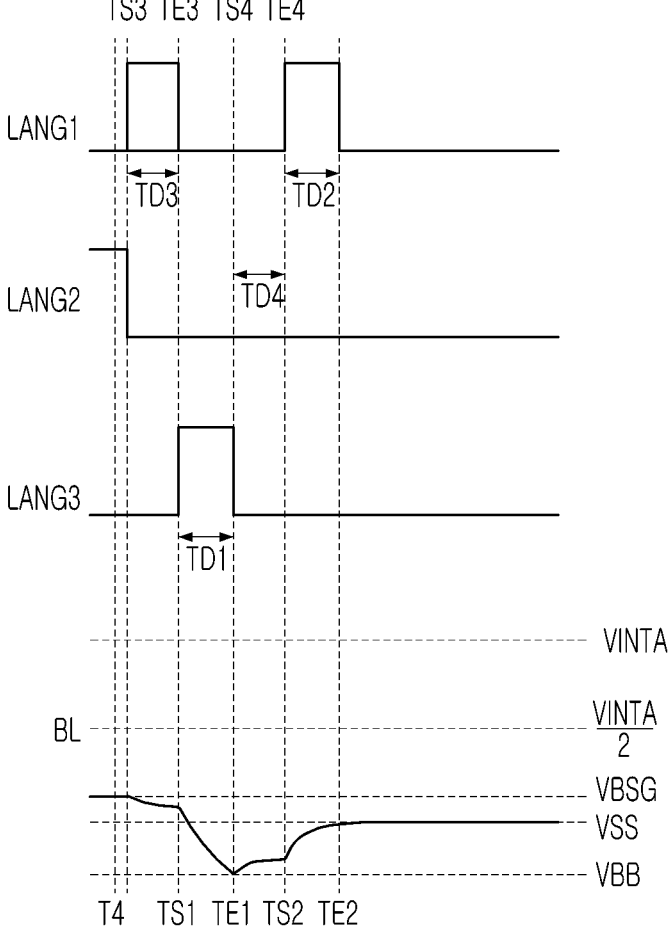

FIGS. 14 and 15 are diagrams provided to explain operation of the semiconductor device according to an example embodiment.

Hereinafter, for convenience of description, the bitline sense amplifier 300 illustrated in FIG. 6 will also be referred to. The charge sharing operation, sensing operation, and storage operation of the bitline sense amplifier 300 may be similar to the example embodiments described above with reference to FIGS. 11 and 13.

In the precharge operation after the third time point T3, An operation for reducing the voltage of the bit line BL to the second power supply voltage VSS lower than the first boost voltage VBSG may be performed. Referring to FIG. 15 illustrating an enlarged timing diagram of signals in the precharge operation, at a fourth time point T4, the first boosting signal LANG2 transitions and the first boosting element BE1 is turned off. The second switch element SW2 may be turned on by the second control signal LANG2.

During the third time TD3 when the second switch element SW2 is turned on, the second power supply voltage VSS is input to the second sense enable line LAB and the bit line BL, and the voltage of the bit line BL may decrease from the first boost voltage VBSG to the second power supply voltage VSS. The start time point TS3 of the third time period TD3 may be later than the fourth time point T4.

When the third time TD3 elapses, the second boosting element BE2 may be turned on by the second boosting signal LANG3 during the first time TD1. As the second boosting element BE2 is turned on, the second boost voltage VBB lower than the second power supply voltage VSS is supplied to the second sense enable line LAB. Accordingly, the voltage of the bit line BL may decrease to a level lower than the second power supply voltage VSS during the first time period TD1. The amount by which the voltage of the bit line BL decreases during the first time period TD1 may be greater than the amount by which the voltage of the bit line BL decreases during the third time period TD3.

The first time TD1 may be substantially the same as the third time TD3. However, the disclosure is not limited thereto, and as such, according to other embodiments, the first time period TD1 and the third time period TD3 may be different from each other. According to an embodiment, FIG. 15 shows that the end time point TE3 of the third time period TD3 coincides with the start time point TS1 of the first time period TD1. However, the disclosure is not limited thereto, and as such, according to other embodiments, the start time TS1 of the first time TD1 may be later than the end time TE3 of the third time TD3.

When the first time TD1 elapses, the second switch element SW2, the first boosting element BE1, and the second boosting element BE2 are all turned off during the fourth time period TD4. The second sense enable line LAB and the bit line BL may be floated. Accordingly, the voltage of the bit line BL, which has decreased to a level lower than the second power supply voltage VSS at the end point TE1 of the first time period TD1, may slowly increase during the fourth time period TD4.

When the fourth time period (TD4) has elapsed, the second switch element (SW2) is turned on by the second control signal (LANG1) during the second time period (TD2), and the second power supply voltage VSS may be supplied to the second sense enable line LAB. Accordingly, as illustrated in FIG. 15, the voltage of the bit line BL may converge to the second power supply voltage VSS during the second time period TD2. In an example embodiment described with reference to FIG. 15, the time from the fourth time point T4 to the end time point TE2 of the second time point TD2 may be set to 10 ns or less.

Figure 16:
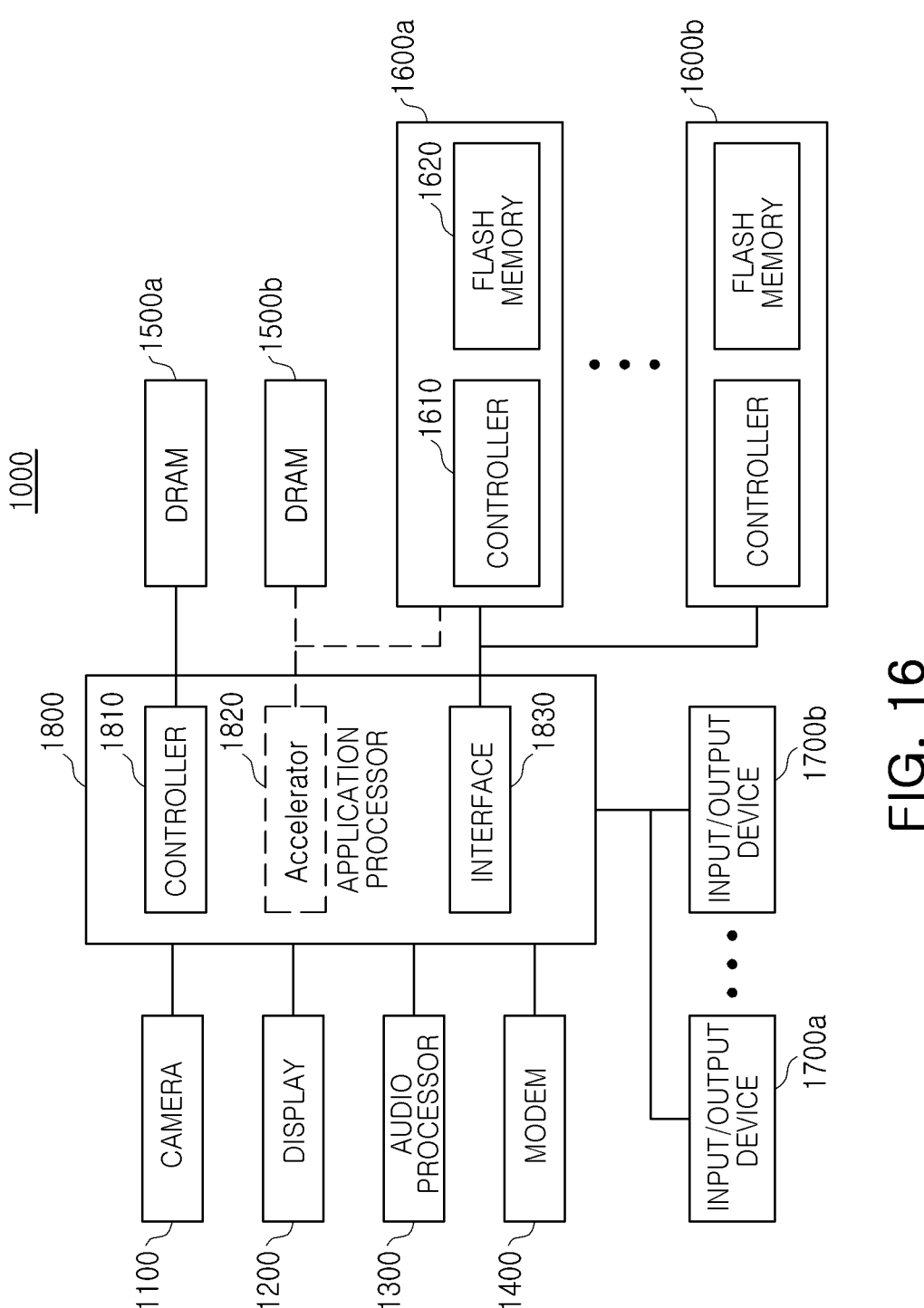
FIG. 16 is a schematic diagram illustrating a system including a semiconductor device according to an example embodiment.

FIG. 16 is a schematic diagram illustrating a system including a semiconductor device according to an example embodiment.

Referring to FIG. 16, a system 1000 may include a camera 1100, a display 1200, an audio processor 1300, a modem 1400, DRAMs 1500*a* and 1500*b*, flash memory devices 1600*a* and 1600*b*, and input/output devices 1700*a* and 1700*b*, and an application processor (hereinafter "AP") 1800. However, the disclosure is not limited thereto, and as such, according to another embodiment, the system 1000 may include additional components, omit or combine one or more of components illustrated in FIG. 16.

The system 1000 may be implemented as a laptop computer, a portable terminal, a smart phone, a tablet PC, a wearable device, a healthcare device, or an Internet-of-Things (IoT) device. However, the system 1000 may be implemented as a server or a personal computer.

The camera 1100 may capture a still image or a moving image according to a control of a user. The system 1000 obtains specific information using a still image/video captured by the camera 1100, and may convert still images/videos into other types of data such as text and store the converted data. The system 1000 may recognize a string included in a still image/video captured by the camera 1100 and provide a text or audio translation corresponding to the string.

The display 1200 may be implemented in various forms such as Liquid Crystal Display (LCD), Organic Light Emitting Diodes (OLED) display, Active-Matrix Organic Light-Emitting Diode (AM-OLED), Plasma Display Panel (PDP), Field Emission Display (FED), electronic paper, etc. In an example embodiment, the display 1200 provides a touch screen function and may be used as an input device of the system 1000. In addition, the display 1200 may be integrally provided with a fingerprint sensor or the like to provide a security function of the system 1000.

The audio processor 1300 may process audio data stored in the flash memory devices 1600a and 1600b or audio data included in content received from the outside through the modem 1400 or the input/output devices 1700a and 1700b. For example, the audio processor 1300 may perform various processes such as coding/decoding, amplification, and noise filtering on audio data.

The modem 1400 modulates and transmits a signal for transmission/reception of wired/wireless data, while restoring an original signal by demodulating a signal received from the outside. The input/output devices 1700a and 1700b are devices that provide digital input and output, and may include a port connectable to an external recording medium, an input device such as a touch screen or a mechanical button key, an output device capable of outputting vibration in a haptic method, and the like. In some examples, the input/output devices 1700a and 1700b may be connected to an external recording medium through a port such as a USB, lightning cable, SD card, microSD card, DVD, network adapter, or the like.

The AP 1800 may control overall operations of the system 1000. Specifically, the AP 1800 may control the display 1200 to display a portion of content stored in the flash memory devices 1600a and 1600b on the screen. In addition, when the AP 1800 receives a user input through the input/output devices 1700a and 1700b, a control operation corresponding to a user input may be performed.

The AP 1800 may be provided as a system-on-chip (SoC) that drives an application program, an operating system (OS), and the like. Also, the AP 1800 may be included in a single semiconductor package together with other devices included in the system 1000, such as the DRAM 1500a, the flash memory 1620, and/or the memory controller 1610. For example, in the form of a package, such as Package on Package (PoP), Ball grid arrays (BGAs), Chip scale packages (CSPs), System In Package (SIP), Multi Chip Package (MCP), Wafer-level Fabricated Package (WFP), Wafer-Level Processed Stack Package (WSP), or the like, at least one device different from the AP 1800 may be provided. A kernel of an operating system running on the AP 1800 may include an input/output scheduler and a device driver for controlling the flash memory devices 1600a and 1600b. The device driver refers to the number of synchronization queues managed by the I/O scheduler to control the access performance of the flash memory devices 1600a and 1600b, or may control the CPU mode inside the SoC, Dynamic Voltage and Frequency Scaling (DVFS) level, and the like.

In an example embodiment, the AP 1800 may include a processor block that executes calculations or drives an application program and/or an operating system, and various other peripheral components connected to the processor block through a system bus. Peripheral components may include a memory controller, an internal memory, a power management block, an error detection block, a monitoring block, and the like. The processor block may include one or more cores, and when the processor block includes a plurality of cores, each of the cores includes a cache memory, and a common cache shared by cores may be included in a processor block.

In an example embodiment, the AP 1800 may include an accelerator block 1820 that is a dedicated circuit for AI data operation. Alternatively, according to embodiments, a separate accelerator chip may be provided separately from the AP 1800, and a DRAM 1500b may be additionally connected to the accelerator block 1820 or the accelerator chip. The accelerator block 1820 is a functional block that performs a specific function of the AP 1800, and may include Graphics Processing Unit (GPU), a functional block that specializes in graphic data processing, Neural Processing Unit (NPU), a block that specializes in AI calculation and inference, and a block specializing in data transmission DPU (Data Processing Unit), and the like.

According to embodiments, the system 1000 may include a plurality of DRAMs 1500a and 1500b. In an example embodiment, the AP 1800 may include a controller 1810 for controlling the DRAMs 1500a and 1500b, and the DRAM 1500a may be directly connected to the AP 1800.

The AP 1800 controls DRAM by setting a command and mode register set (MRS) that conforms to the JEDEC standard, or may communicated by setting specifications and functions required by the mobile system 1000, such as low voltage/high speed/reliability, and DRAM interface rules for CRC/ECC. For example, the AP 1800 may communicate with the DRAM 1500a through an interface conforming to JEDEC standards such as LPDDR4 and LPDDR5. Alternatively, the AP 1800 may also communicate by setting a new DRAM interface protocol to control the accelerator block 1820 or the accelerator chip provided separately from the AP 1800, the accelerator DRAM 1500b having a higher bandwidth than the DRAM 1500a.

Although DRAMs 1500a and 1500b are illustrated in FIG. 16, the disclosure is not limited thereto, and as such, according to another embodiment, other types of memories, other than the DRAMs 1500a and 1500b may also be included in the mobile system 1000. In an example, various types of memories may be included in the mobile station 1000 depending on the bandwidth, response speed, and voltage conditions of the AP 1800 or the accelerator block 1820. For example, the controller 1810 and/or the accelerator block 1820 may control various memories such as PRAM, SRAM, MRAM, RRAM, FRAM, hybrid RAM, and the like.

In the DRAMs 1500a and 1500b, four basic operations of addition/subtraction/multiplication/division and vector operation, address operation, or FFT operation data may be stored. In another embodiment, the DRAMs 1500a and 1500b may be provided as a processing in memory (PIM) equipped with an arithmetic function. For example, a function for execution used for inference may be performed within the DRAMs 1500a and 1500b. In this case, inference may be performed in a deep learning algorithm using an artificial neural network. The deep learning algorithm may include a training step of learning a model through various data and an inference step of recognizing data with the learned model. For example, functions used for inference may include a hyperbolic tangent function, a sigmoid function, a Rectified Linear Unit (ReLU) function, and the like.

Operations such as reading data or writing data stored in memory cells in the DRAMs 1500a and 1500b may be performed by bitline sense amplifiers connected to the memory cells through bit lines. Bitline sense amplifiers included in the DRAMs 1500a and 1500b may be implemented and operated according to the above-described embodiments. In detail, each of the bitline sense amplifiers may include a switch circuit that selectively applies a first boost voltage higher than the second power supply voltage or a second boost voltage, lower than the second power supply voltage, to the bit line. By applying the second boost voltage to the bit line for at least a portion of the time during a read operation or a write operation for the selected memory cell, DRAMs 1500a and 1500b with improved performance and reliability may be implemented.

According to an embodiment, the system 1000 may include a plurality of storages or a plurality of flash memory devices 1600a and 1600b having a larger capacity than the DRAMs 1500a and 1500b. The flash memory devices 1600a and 1600b may include a controller 1610 and a flash memory 1620. The controller 1610 receives a control command and data from the AP 1800, and writes data to the flash memory 1620 based on the control command, or may read data stored in the flash memory 1620 and transmit the data to the AP 1800.

In an example embodiment, the AP 1800 may include an interface 1830, and thus the flash memory devices 1600a and 1600b may be directly connected to the AP 1800. For example, the AP 1800 may be implemented as an SoC, and the flash memory device 1600a may be implemented as a separate chip different from the AP 1800. The AP 1800 and the flash memory device 1600a may be mounted in one package. However, embodiments of the disclosure are not limited thereto, and the plurality of flash memory devices 1600a and 1600b may be electrically connected to the mobile system 1000 through a connection.

As set forth above, according to an example embodiment, a boosting voltage of a negative level lower than the reference voltage may be applied to the bitline sense amplifier through one of the sense enable lines connected to the bitline sense amplifier. In a recovery operation of rewriting data to the memory cell after the read operation, the voltage level of the bit line may be surely reduced to the reference voltage by applying a negative level boosting voltage to the bit line maintained at a low voltage level. Accordingly, performance and reliability of the semiconductor device may be improved by accurately restoring existing data in a memory cell after a read operation and accurately setting voltages of bit lines to target levels.

While example embodiments have been illustrated and described above, it will be apparent to those skilled in the art that modifications and variations could be made without departing from the scope of the disclosure as defined by the appended claims.

What is claimed is:

1. A bitline sense amplifier comprising:
a first inverter having a first input terminal connected to a bit line and a first output terminal connected to a complementary bit line, the first inverter connected between a first sense enable line and a second sense enable line;
a second inverter having a second input terminal connected to the complementary bit line and a second output terminal connected to the bit line, the second inverter connected between the first sense enable line and the second sense enable line;
a first switch circuit comprising a first switch element connected between a first power node and the first sense enable line, the first power node configured to supply a first power supply voltage; and
a second switch circuit connected to the second sense enable line, the second switch circuit comprising:
a second switch element connected between a second power node and the second sense enable line, the second power node configured to supply a second power supply voltage lower than the first power supply voltage,
a first boosting element connected between a first boosting node and the second sense enable line, the first boosting node configured to supply a first boost voltage higher than the second power supply voltage and lower than half of the first power supply voltage, and
a second boosting element connected between a second boosting node and the second sense enable line, the second boosting node configured to supply a second boost voltage lower than the second power supply voltage,
wherein the second switch element, the first boosting element and the second boosting element are connected in parallel and are configured to be turned on in a non-overlapping manner.

2. The bitline sense amplifier of claim 1, wherein the second switch element comprises a plurality of second switch elements connected to each other in parallel between the second power node and the second sense enable line.

3. The bitline sense amplifier of claim 2, wherein a number of the first boosting element is less than a number of the plurality of second switch elements, and a number of the second boosting element is less than the number of the plurality of second switch elements.

4. The bitline sense amplifier of claim 1, wherein each of the second switch element, the first boosting element, and the second boosting element is an NMOS transistor.

5. The bitline sense amplifier of claim 4, wherein a gate of the second switch element is connected to a first control line, a gate of the first boosting element is connected to a second control line, and a gate of the second boosting element is connected to a third control line.

6. The bitline sense amplifier of claim 1, wherein the first switch element is a PMOS transistor,
the first switch circuit further comprises at least one current control element connected in parallel with the first switch element between the first power node and the first sense enable line, and
the at least one current control element is an NMOS transistor.

7. The bitline sense amplifier of claim 1, wherein the second boosting element is configured to supply the second boost voltage lower than the second power supply voltage during a precharging period.

8. A semiconductor device comprising:
a first inverter and a second inverter connected to a bit line and a complementary bit line;

a first switch circuit comprising a first switch element configured to supply a first power supply voltage to the first inverter and the second inverter through a first sense enable line;

a second switch circuit configured to supply at least one of a second power supply voltage, a first boost voltage or a second boost voltage to the first inverter and the second inverter through a second sense enable line, the first boost voltage being higher than the second power supply voltage and lower than half of the first power supply voltage, and the second boost voltage being lower than the second power supply voltage; and control logic circuit configured to control the first switch circuit and the second switch circuit to execute a control operation on a memory cell connected to one of the bit line or the complementary bit line, wherein the control logic circuit is configured to sequentially supply the second boost voltage and the second power supply voltage to the second sense enable line, and wherein the second switch element, the first boosting element and the second boosting element are connected in parallel and are configured to be turned on in a non-overlapping manner.

9. The semiconductor device of claim 8, wherein the control logic circuit is configured to sequentially supply the second boost voltage and the second power supply voltage to the second sense enable line in response to a sensing operation or in a precharge operation, and wherein the control logic circuit is configured to perform a restore operation on the memory cell between the sensing operation and the precharge operation.

10. The semiconductor device of claim 9, wherein the second switch circuit comprises a second switch element connected between a second power node and the second sense enable line, a first boosting element connected between a first boosting node and the second sense enable line, and a second boosting element connected between a second boosting node supplying the second boost voltage and the second sense enable line, the second power node configured to supply the second power supply voltage, the first boosting node configured to supply the first boost voltage and the second boosting node configured to supply the second boost voltage.

11. The semiconductor device of claim 10, wherein the control logic circuit is configured to turn on the second boosting element for a first time period after turning off the first boosting element, and turn on the second boosting element for a second time period after turning off the second boosting element, in the precharge operation.

12. The semiconductor device of claim 11, wherein an end time of the first time period is earlier than a start time of the second time period.

13. The semiconductor device of claim 11, wherein the first time period is shorter than the second time period.

14. The semiconductor device of claim 11, wherein the control logic circuit is configured to turn off the second switch element, the first boosting element, and the second boosting element between an end time of the first time period and a start time of the second time period to float the second sense enable line.

15. The semiconductor device of claim 14, wherein a third time period during which the second sense enable line is floated is shorter than the second time period.

16. The semiconductor device of claim 11, wherein the control logic circuit configured to turn on the second switch element during a fourth time period before turning on the second boosting element and after turning off the first boosting element.

17. The semiconductor device of claim 16, wherein the control logic circuit configured to turn off the second switch element, the first boosting element, and the second boosting element between an end time of the first time period and a start time of the second time period to float the second sense enable line.

18. The semiconductor device of claim 11, wherein a fifth time period from the turning off time of the first boosting element to an end time of the second time period is 10 ns or less.

19. A bitline sense amplifier comprising:

an amplifier circuit having a plurality of p-channel metal-oxide semiconductor (PMOS) elements and a plurality of n-channel metal-oxide semiconductor (NMOS) elements;

a first switch circuit configured to supply a first power supply voltage to the plurality of PMOS elements; and a second switch circuit configured to supply one of a second power supply voltage, a first boost voltage, or a second boost voltage to the plurality of NMOS elements, the second power supply voltage being lower than the first power supply voltage, the first boost voltage being higher than the second power supply voltage and lower than half of the first power supply voltage, and the second boost voltage being lower than the second power supply voltage, wherein, based on an execution of a read operation, the second switch circuit is configured to sequentially apply the first boost voltage, the second boost voltage, and the second power supply voltage to the plurality of NMOS elements, and wherein the second switch element, the first boosting element and the second boosting element are connected in parallel and are configured to be turned on in a non-overlapping manner.

20. The bitline sense amplifier of claim 19, wherein the second switch circuit first applies the second power supply voltage before applying the first boost voltage to the plurality of NMOS elements.

* * * * *